United States Patent
Huang

(10) Patent No.: US 9,642,268 B2
(45) Date of Patent: May 2, 2017

(54) SUPPORT ASSEMBLY AND DISPLAY DEVICE

(71) Applicants: BOE TECHNOLOGY GROUP CO., LTD., Beijing (CN); BEIJING BOE VISION-ELECTRONIC TECHNOLOGY CO., LTD., Beijing (CN)

(72) Inventor: Wei Huang, Beijing (CN)

(73) Assignees: BOE TECHNOLOGY GROUP CO., LTD., Beijing (CN); BEIJING BOE VISION-ELECTRONIC TECHNOLOGY CO., LTD., Beijing (CN)

( * ) Notice: Subject to any disclaimer, the term of this patent is extended or adjusted under 35 U.S.C. 154(b) by 24 days.

(21) Appl. No.: 14/437,084

(22) PCT Filed: Sep. 28, 2014

(86) PCT No.: PCT/CN2014/087703
§ 371 (c)(1),
(2) Date: Apr. 20, 2015

(87) PCT Pub. No.: WO2015/074462
PCT Pub. Date: May 28, 2015

(65) Prior Publication Data
US 2016/0007489 A1    Jan. 7, 2016

(30) Foreign Application Priority Data
Nov. 19, 2013    (CN) .................. 2013 2 0735888 U

(51) Int. Cl.
*G06F 1/16*    (2006.01)
*H05K 5/02*    (2006.01)
(Continued)

(52) U.S. Cl.
CPC ............ *H05K 5/0204* (2013.01); *F16M 11/10* (2013.01); *F16M 11/16* (2013.01); *F16M 11/22* (2013.01);
(Continued)

(58) Field of Classification Search
CPC ........ F16M 11/04; F16M 11/16; F16M 11/10; F16M 11/22; F16M 2200/08;
(Continued)

(56) References Cited

U.S. PATENT DOCUMENTS 8,059,399 B2 * 11/2011 Huang .................. F16M 11/16
                                                                     248/176.1
2010/0265640 A1 * 10/2010 Morita ..................... H04N 5/64
                                                                     361/679.01

FOREIGN PATENT DOCUMENTS

CN    102679102 A    12/2012
CN    202580509 U    12/2012

OTHER PUBLICATIONS

International Search Report mailed Dec. 16, 2014; Appln. No. PCT/CN2014/087703.
(Continued)

*Primary Examiner* — Anthony Haughton
*Assistant Examiner* — Ingrid Wright
(74) *Attorney, Agent, or Firm* — Ladas & Parry LLP

(57) ABSTRACT

A support assembly and a display device are provided. The support assembly comprises a support frame (3) and a carrier frame (1) provided at an upper end of the support frame (3). The carrier frame (1) comprises a lower connecting member (12) and an upper connecting member (11) which are connected through a rotating shaft (13). The lower connecting member (12) is fixed to the upper end of the support frame (3), and the upper connecting member (11) comprises an engagement structure. This support assembly
(Continued)

is used to improve the detachability between the support assembly and the display.

7 Claims, 4 Drawing Sheets

(51) Int. Cl.
*F16M 11/10* (2006.01)
*F16M 11/22* (2006.01)
*F16M 11/16* (2006.01)
*H05K 5/00* (2006.01)

(52) U.S. Cl.
CPC ......... *H05K 5/0017* (2013.01); *H05K 5/0234* (2013.01); *F16M 2200/08* (2013.01)

(58) Field of Classification Search
CPC .... G06F 1/1616; G06F 1/1601; G06F 1/1637; H05K 5/0017; H05K 5/0204; H05K 5/0234
USPC ............ 361/679.01, 679.02, 679.22, 679.09, 361/679.26, 679.27; 248/917–924
See application file for complete search history.

(56) References Cited

OTHER PUBLICATIONS

Written Opinion of the International Searching Authority mailed Dec. 16, 2014; PCT/CN2014/087703.

\* cited by examiner

SUPPORT ASSEMBLY AND DISPLAY DEVICE

TECHNICAL FIELD

At least one embodiment of the present disclosure relates to a support assembly and a display device.

BACKGROUND

Currently, a display device usually includes a display and a support assembly for supporting the display, and the support assembly is generally fixed to a rear case of the display through screws. When it is desired to mount the support assembly to the rear case of the display, it is necessary to tighten the screws to complete the connection between the support assembly and the display. When a user wants to mount the display device on a wall, in this case, the display does not need to be supported by the support assembly, and it is necessary to loosen the screws to separate the support assembly from the display.

SUMMARY

At least one embodiment of the present disclosure provides a support assembly and a display device to improve the detachability between the support assembly and the display.

At least one embodiment of the present disclosure provides a support assembly, which comprises a support frame and a carrier frame provided at an upper end of the support frame. The carrier frame includes a lower connecting member and an upper connecting member which are connected through a rotating shaft, the lower connecting member is fixed to the upper end of the support frame and the upper connecting member comprises an engagement structure.

At least one embodiment of the present disclosure further provides a display device comprising a display and a support assembly. A mounting groove is provided at a rear case of the display, and the support assembly includes a support frame and a carrier frame provided at an upper end of the support frame. The carrier frame includes a lower connecting member and an upper connecting member which are connected through a rotating shaft, the lower connecting member is fixed to the upper end of the support frame, the upper connecting member comprises an engagement structure, and the upper connecting member and the rear case of the display are fixed through engagement between the engagement structure and the mounting groove.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

1: carrier frame, 11: upper connecting member, 111: position limiting hole, 112: first protrusion portion, 113: bending portion, 114: bending portion end surface, 115: second protrusion portion, 12: lower connecting member, 121: threaded hole, 13: rotating shaft, 2: rear case, 21: elastic sheet, 211: concave portion, 22: lateral surface of mounting groove, 23: second slot portion, 24: first slot portion, 25: first end surface, 26, 27: enforcement rib, 3: support frame, 31: operation window.

DEEND PARTED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The inventor of the present application noted that in a display device, the connection mode of fixing the support assembly to the rear case of the display through screws makes the disassembly and assembly between the support assembly and the display very inconvenient.

In order to improve the detachability between the support assembly and the display, at least one embodiment of the present disclosure provides a support assembly and a display device comprising this support assembly. The support assembly is connected with a rear case of the display in an engagement manner, and compared with fastening connection, and the detachability between the support assembly and the display is significantly improved.

In order to make those skilled in the art to understand the technical solutions of the embodiments of the present disclosure better, hereinafter, the embodiments of the present disclosure will be described in detail with reference to the accompanying drawings.

Figure 1:
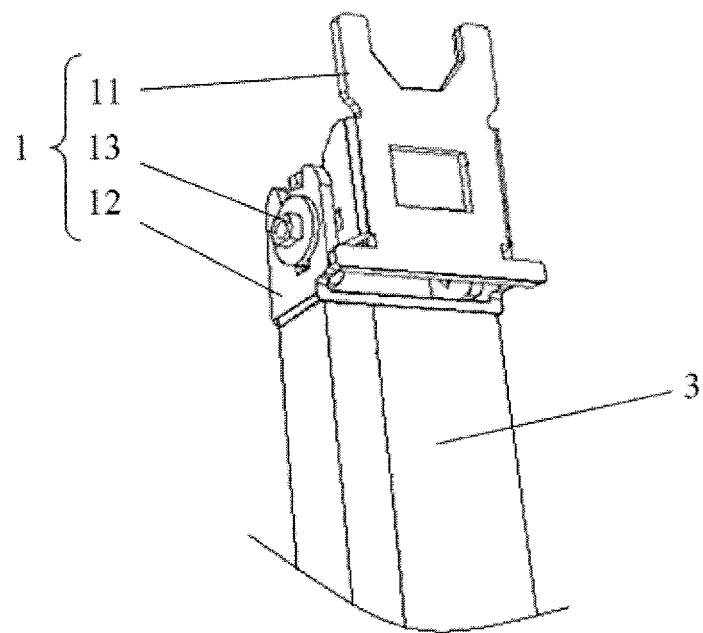
FIG. 1 is a schematic view for illustrating a structure of a support assembly provided by an embodiment of the present disclosure.

FIG. 1 is a schematic view for illustrating a structure of a support assembly provided by an embodiment of the present disclosure. The embodiment of the present disclosure provides a support assembly configured for supporting a display. The support assembly includes a support frame 3 and a carrier frame 1 provided at an upper end of the support frame 3. The carrier frame 1 includes a lower connecting member 12 and an upper connecting member 11 which are connected through a rotating shaft 13, the lower connecting member 12 is fixed to an upper end of the support frame 3, and the upper connecting member comprises an engagement structure configured to be fixed with a rear case of the display in an engagement manner. The display, for example, is a flat panel display, such as a liquid crystal display, an OLED display, or also may be other kind of display, such as a light-emitting diode display or a CRT display.

In one example, the lower connecting member 12 is provided with a plurality of threaded holes 121, and the lower connecting member 12 can be fixed to the support frame 3 through screws and the threaded holes 121, and embodiments of the present disclosure are not limited thereto. The structure of the rotating shaft 13, the connection manner between the rotating shaft 13 and the upper connecting member 11 and the connection manner between the rotating shaft 13 and the lower connecting member 12 can adopt structures well known to the skilled in the art, for example, can adopt a pin joint manner, and detailed description is omitted herein. By the above-mentioned support assembly, the upper connecting member 11 can be fixed with the rear case of the display in an engagement manner by using the engagement structure of the upper connecting member, so that it can be completed to fix the support assembly to the rear case of the display, and when it is required to detach the support assembly from the display, the detachment can be completed only by separating the upper connecting member 11 from the rear case of the display. Therefore, compared with the fastening connection, the detachability between the support assembly and the display is significantly improved.

Figure 2:
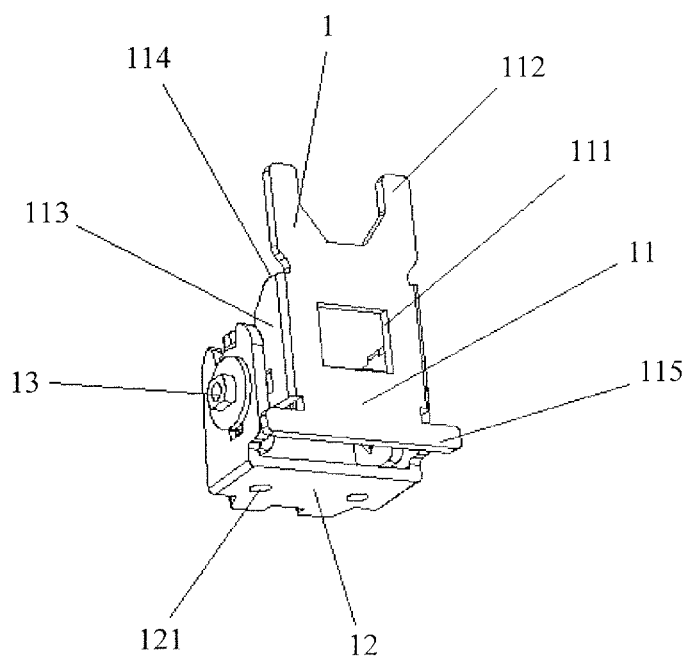
FIG. 2 is a schematic view for illustrating a structure of an engagement structure on the carrier frame of FIG. 1.

FIG. 2 is a schematic view for illustrating a structure of the carrier frame in FIG. 1. In one example, the carrier frame 1 includes the lower connecting member 12 and the upper connecting member 11 which are connected through the rotating shaft 13, the lower connecting member 12 is fixed to the upper end of the support frame 3, and the upper connecting member 11 comprises the engagement structure. The engagement structure includes a position limiting hole 111 provided at a predetermined position in the upper connecting member 11, a first protrusion portion 112 extending from a head of the upper connecting member 11 along a longitudinal direction of the upper connecting member, a second protrusion portion 115 extending from an end part of the upper connecting member 11 along a lateral direction of the upper connecting member 11. Correspondingly, the rear case of the display comprises a mounting groove matching with the above-mentioned engagement structure.

In one example, the above-mentioned engagement structure further includes two bending portions 113 respectively located at two sides of the upper connecting member 11 and bent towards the lower connecting member 12. By this design, the engagement structure can be used to prevent the upper connecting member 11 from moving rightward and leftward with respect to the rear case of the display, thus the support assembly is fixed to the rear case of the display in an engagement manner, and the stability of the engagement between the upper connector 11 and the rear case of the display is improved.

Figure 3:
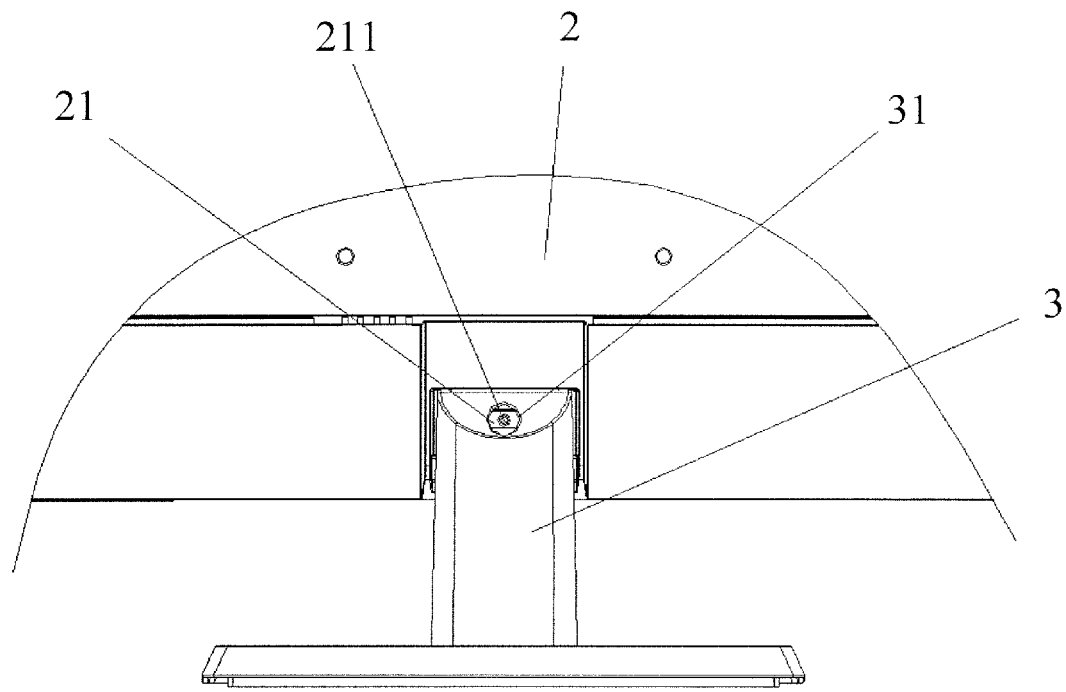
FIG. 3 is a schematic view for illustrating a structure of a display device provided by an embodiment of the present disclosure.
Figure 4:
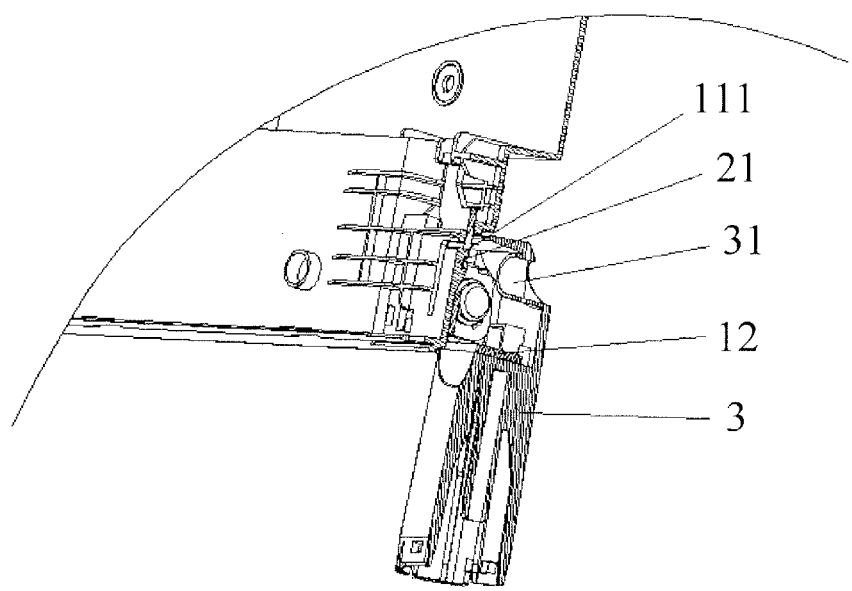
FIG. 4 is a cross sectional view for illustrating assembly of the display device in FIG. 3.

Referring to FIG. 3 and FIG. 4, FIG. 3 is a schematic view for illustrating a structure of a display device provided by an embodiment of the present disclosure, and FIG. 4 is a assembly cross sectional view of the display device in FIG. 3. Embodiments of the present disclosure further provide a display device comprising a display and a support assembly for supporting the display. A rear case 2 of the display is provided with a mounting groove; and the support assembly comprises a support frame 3 and a carrier frame 1 provided at an upper end of the support frame 3, the carrier frame 1 comprises: a lower connecting member 12 and an upper connecting member 11 which are connected through a rotating shaft 13, the lower connecting member 12 is fixed to the upper end of the support frame 3, and the upper connecting member 11 comprises an engagement structure. The upper connecting member 11 is fixed to the rear case 2 of the display through the engagement between the engagement structure and the mounting groove.

Figure 5:
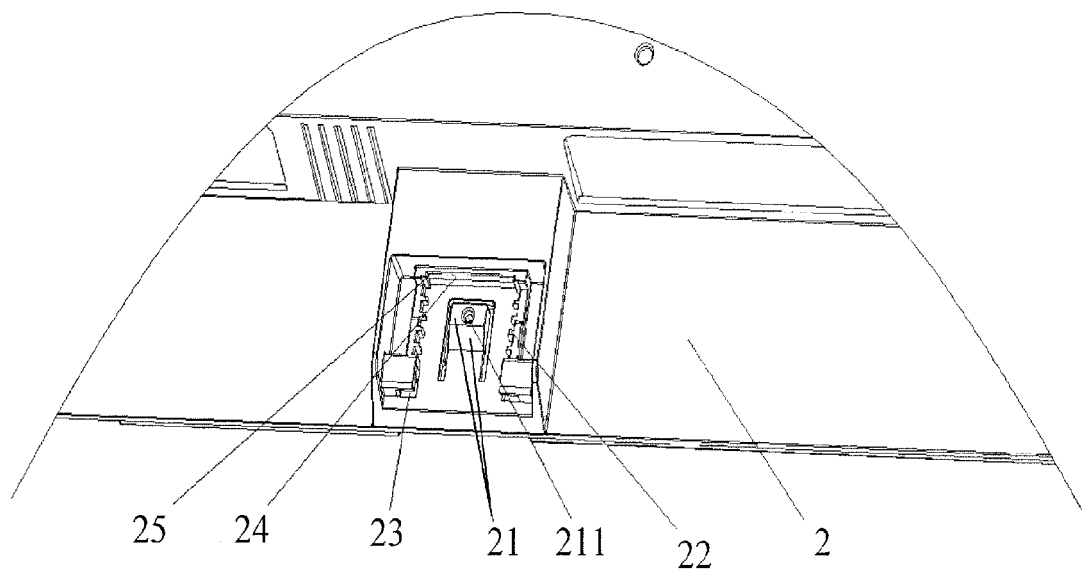
FIG. 5 is a schematic view for illustrating a structure of a mounting groove in FIG. 3.
Figure 6:
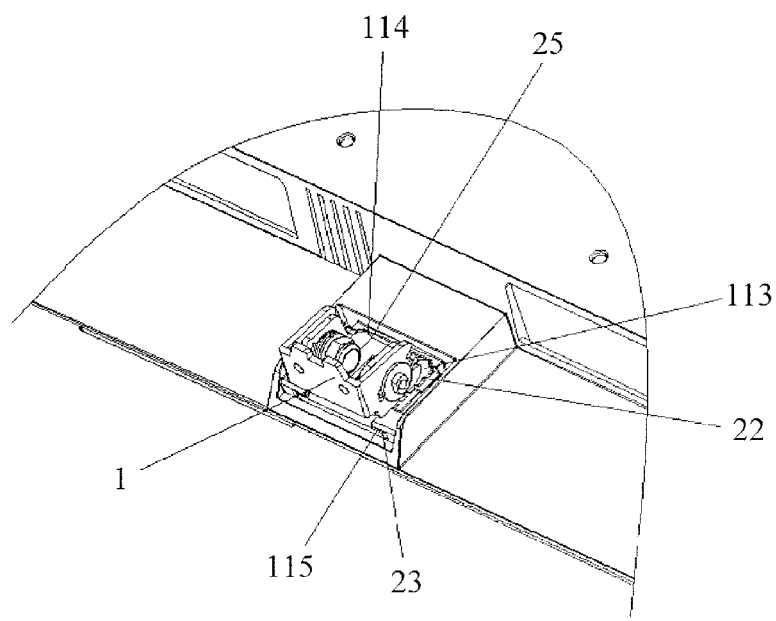
FIG. 6 is a schematic view for illustrating a structure after a carrier frame is connected with a mounting groove in an engagement manner.

Referring to FIG. 2, FIG. 5 and FIG. 6, FIG. 5 is a schematic view for illustrating a structure of the mounting groove in FIG. 3, and FIG. 6 is a schematic view for illustrating a structure after an engagement between the carrier frame and the mounting groove. In one example, the engagement structure includes a position limiting hole 111 provided at a predetermined position in the upper connecting member 11, a first protrusion portion 112 extending from a head of the upper connecting member 11 along a longitudinal direction of the upper connecting member 11, and a second protrusion portion 115 extending from an end part of the upper connecting member 11 along a lateral direction of the upper connecting member 11. Accordingly, the above-mentioned mounting groove comprises a first slot portion 24 accommodating the first protrusion portion 112 and being configured for matching with the first protrusion portion 112, a second slot portion 23 accommodating the second protrusion portion 115 and being configured for matching with the second protrusion portion 115, and an elastic sheet 21 configured for connecting with the position limiting hole 111 in an engagement manner when the upper connecting member 11 is inserted into the mounting groove.

In one example, the above-mentioned upper connecting member 11 includes a plate-like body having the position limiting hole 111, and there is no limitation on the shape of the position limiting hole 111. In one example, the longitudinal direction of the upper connecting member is the length direction of the plate-like body, and the lateral direction of the upper connecting member is perpendicular to the length direction of the plate-like body. In this case, the first protrusion portion 112 is extending from the head of the plate-like body along the length direction of the plate-like body, the structure of the first protrusion portion 112 is shown in FIG. 2, the second protrusion portion 115 is extending from the end part of the plate-like body along a direction perpendicular to the length direction of the plate-like body, and the structure of the second protrusion portion 115 is shown in FIG. 2. In one example, the mounting groove is a square-shaped groove, and the mounting groove comprises a first opening facing away from the display surface of the display and a second opening facing the ground, so as to facilitate to insert the upper connecting member 11 into the mounting groove, and thus to fix the support assembly with the rear case 2 in an engagement manner. An elastic sheet 21 is provided on the bottom surface of the mounting groove, a portion of the elastic sheet 21, which portion corresponds to the free end of the elastic sheet 21, for example, is of a convex platform structure for engaging with the position limiting hole 111. After the elastic sheet 21 is connected with the position limiting hole 111 in an engagement manner, the upper connecting member 11 can be prevented from retracting from the mounting groove, that is, the carrier frame 1 is prevented from moving upward and downward with respect to the rear case 2. In one example, the mounting groove includes a first slot portion 24 and a second slot portion 23. The first slot portion 24 is located in a first end surface 25, facing the ground, of the mounting groove, and the depth direction of the first slot portion 24 is perpendicular to the first end surface. The second slot portion 23 is located in the second opening of the mounting groove. When the upper connecting member 11 is inserted into the mounting groove, the upper connecting member 11 enters the mounting groove from the second opening and presses the elastic sheet 21 to deform so that the elastic sheet 21 contacts the bottom surface (the surface opposing to the first opening) of the mounting groove. After the first protrusion portion 112 is inserted into the first slot portion 24, lateral surfaces, inserted into the first slot portion 24, of the first protrusion portion 112, are respectively contact the first slot portion 24, that is, the first protrusion portion 112 matches with the first slot portion 24, meantime the elastic sheet 21 rebounds and is connected with the position limiting hole 111 in an engagement manner, and at the same time, the second protrusion portion 115 is inserted into the second slot portion 23 and matches with the second slot portion 23. Through the engagement between the first protrusion portion 112 and the first slot portion 24, the engagement between the position limiting hole 111 and the elastic sheet 21, and the engagement between the second protrusion portion 115 and the second slot portion 23, the upper connecting member 11 is restricted from moving in front and rear, upward and downward, leftward and rightward directions with respect to the rear case 2, that is, the upper connecting member 11 is fixed to the rear case 2 in an engagement manner. When it is required to detach the support assembly from the rear case 2, by pressing the free end of the elastic sheet 21 so that the elastic sheet 21 contacts the bottom surface of the mounting groove, the upper connecting member 11 can be retracted from the mounting groove, and the detachment is completed. Therefore, compared with the connection manner by fasteners, the detachability between the support assembly and the display is significantly improved.

Continuously referring to FIG. 2, in order to further improve the stability of the engagement between the upper connecting member 11 and the rear case 2, in one example, the above-mentioned engagement structure can further include two bending portions 113 respectively located at two sides of the upper connecting member 11 and bent to the lower connecting member 12. When the upper connecting member 11 is inserted into the mounting groove, two end surfaces, facing the first slot portion 24, of the two bending portion 113 respectively match with the end surface, facing the two bending portions 113, of the mounting groove, that is, contact the first end surfaces 25, facing the ground, of the mounting groove, and two lateral surfaces, facing the mounting groove, of the two bending portions 113 respectively match with two lateral surfaces, facing the two bending portions, of the mounting groove. In one example, as shown in FIG. 2 and FIG. 6, the end surfaces 114 of the bending portions contact the first end surface 25, facing the ground, of the mounting groove, the lateral surfaces, facing the mounting groove, of the bending portions contact the lateral surfaces 22 of the mounting groove, thus the upper connecting member 11 is further restrict from moving leftward and rightward with respect to the rear case 2, and hence the stability of the engagement between the upper connecting member 11 and the rear case 2 is further improved.

Figure 7:
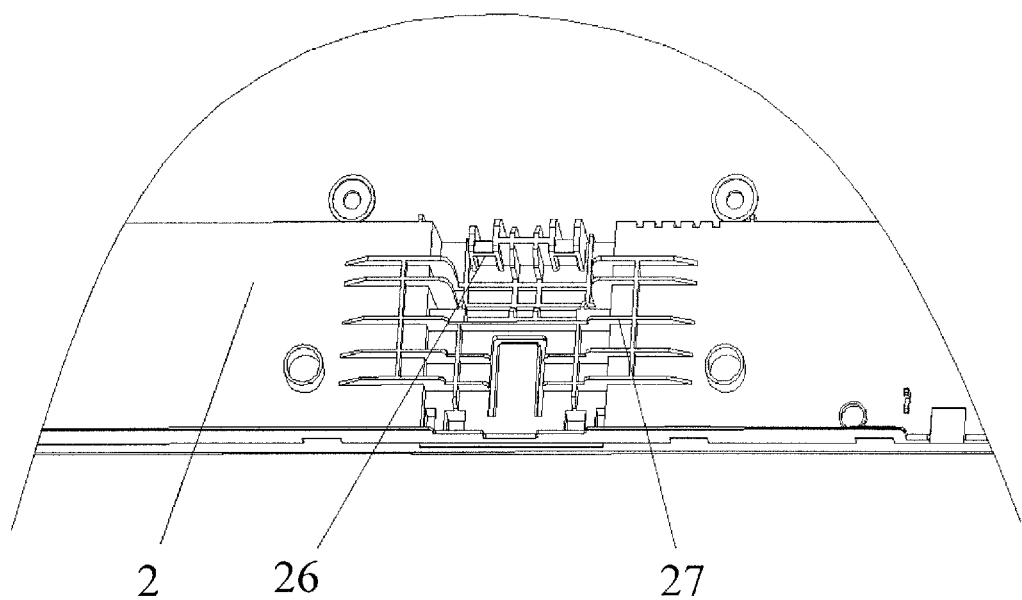
FIG. 7 is a schematic view for illustrating a structure of a mounting groove having enforcement ribs.
Figure 8:
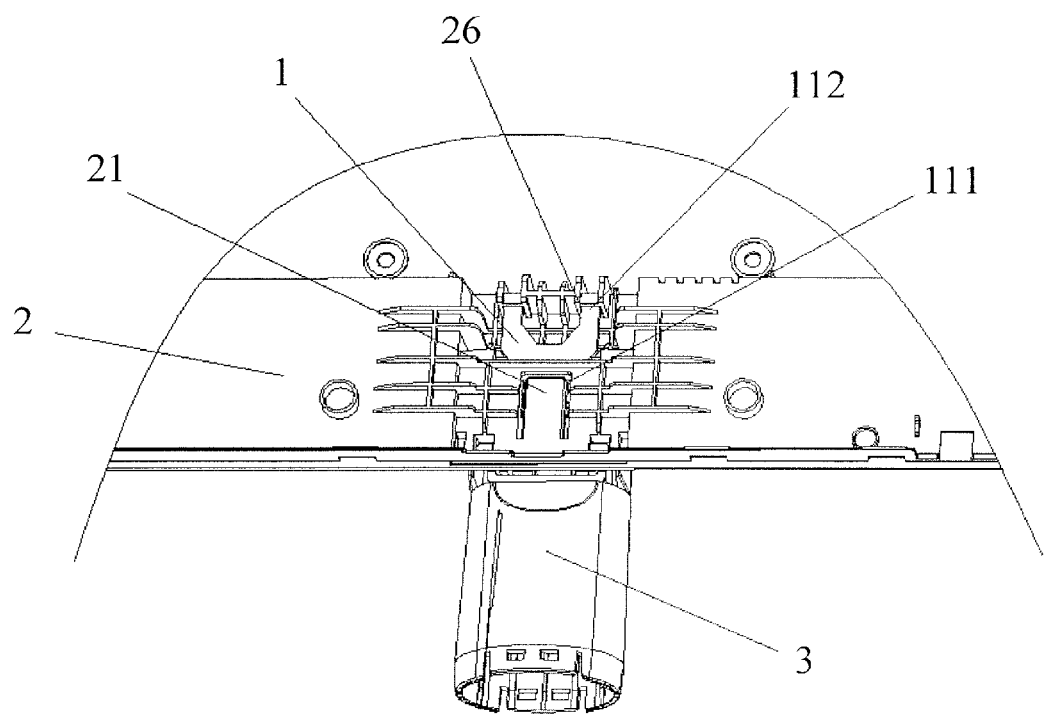
FIG. 8 is a schematic view for illustrating a structure after a support assembly is connected with a mounting groove in an engagement manner.

Referring to FIG. 7 and FIG. 8, FIG. 7 is a schematic view for illustrating a structure of the mounting groove having enforcement ribs, and FIG. 8 is a schematic view for illustrating a structure after the engagement between the support assembly and the mounting groove. In one example, the above-mentioned mounting groove is provided with a plurality of enforcement ribs on the two lateral surfaces and/or one end surface, and the two lateral surfaces and/or one end surface matches with the two bending portions 113. In one example, the two lateral surfaces of the mounting groove are respectively provided with a plurality of enforcement ribs 27. In one example, the first end surface 25 of the mounting groove facing the ground is provided with a plurality of enforcement ribs 26. By this design, even the upper connecting member 11 is inserted into the mounting groove many times, the mounting groove would not be damaged, that is, the service life of the mounting groove is prolonged, and in addition, it is also possible to improve the stability of the engagement between the upper connecting member 11 and the rear case 2.

Continuously referring to FIG. 2, in order to facilitate to apply an external force to the free end of the elastic sheet 21 so that the elastic sheet 21 contacts the bottom surface of the mounting groove to complete the detachment of the elastic sheet 21 from the position limiting hole 111, in one example, the free end of the elastic sheet 21 is provided with a concave portion 211 for facilitating to be pressed.

In the above embodiments, the support frame 3 is generally a support frame having a plurality of grid holes, when it is required to press the elastic sheet 21 to separate the elastic sheet 21 from the position limiting hole 111, the external force can be applied to the elastic sheet 21 through the grid holes. When the support frame 3 is a cylindrical support frame, the area, opposing to the position limiting hole 111, of the support frame 3 is provided with an operation window 31 configured for separating the elastic sheet 21 from the position limiting hole 111.

In summary, in the above support assembly, by using the engagement structure of the upper connecting member to fix the upper connecting member with the rear case of the display in an engagement manner, the support assembly can be firmly mounted on the rear case of the display. When it is required to detach the support assembly from the display, the detachment can be done only by separating the upper connecting member and the engagement structure from the rear case of the display. Therefore, compared with the fastening connection manner, the detachability between the support assembly and the display can be significantly improved.

In the accompanying drawings, only one example in which one support assembly is fixed to the back surface of the display in an engagement manner is shown. In another example of the present disclosure, one support assembly may include at least two carrier frames arranged side by side, each of the carrier frames includes a lower connecting member and an upper connecting member connected through a rotating shaft, the at least two carrier frames may support the same display or support different displays. Because they have the same operation principle as that shown in the accompanying drawings, detailed descriptions are omitted herein.

It is apparent to those skilled in the art to make various modifications and variations to the present invention without departing from the spirit and scope of the present invention. In this way, if these modifications and variations belong to the scope of the claims of the present invention and their equivalents, then the present invention is intended to cover these modifications and variations.

The present application claims the priority of Chinese Patent Application No. 201320735888.4, filed on Nov. 19, 2013, which is hereby entirely incorporated by reference as a part of the present application.

What is claimed is:

1. A display device, comprising: a display and a support assembly, wherein
   a rear case of the display is provided with a mounting groove; and
   the support assembly comprises a support frame and a carrier frame provided at an upper end of the support frame, wherein the carrier frame comprises: a lower connecting member and an upper connecting member which are connected through a rotating shaft, the lower connecting member is fixed to the upper end of the support frame, the upper connecting member comprises an engagement structure, and the upper connecting member is fixed to the rear case of the display through engagement between the engagement structure and the mounting groove, wherein the engagement structure comprises a first protrusion portion extending from a head of the upper connecting member along a longitudinal direction of the upper connecting member; and the mounting groove comprises a first slot portion accommodating the first protrusion portion and matching with the first protrusion portion.

2. The display device according to claim 1, wherein the engagement structure further comprises a position limiting hole provided at a predetermined position in the upper connecting member; and the mounting groove further comprises an elastic sheet which is configured to be connected with the position limiting hole in an engagement manner in inserting the upper connecting member into the mounting groove.

3. The display device according to claim 2, wherein a free end of the elastic sheet is provided with a concave portion.

4. The display device according to claim 2, wherein the support frame is a cylindrical frame, and an area, opposing to the position limiting hole, of the support frame is provided with an operation window configured for separating the elastic sheet from the position limiting hole.

5. The display device according to claim 1, wherein the engagement structure further comprises a second protrusion portion extending from an end part of the upper connecting member along a lateral direction of the upper connecting member; and the mounting groove further comprises a second slot portion accommodating the second protrusion portion and matching with the second protrusion portion.

6. The display device according to claim 1, wherein the engagement structure further comprises: two bending portions respectively located at two sides of the upper connecting member and bent towards the lower connecting member; and upon the upper connecting member being inserted into the mounting groove, two end surfaces, facing the first slot portion, of the two bending portions respectively match with an end surface, facing the two bending portions, of the mounting groove, and two lateral surfaces, facing the mounting groove, of the two bending portions respectively match with two lateral surfaces, facing the two bending portions, of the mounting groove.

7. The display device according to claim 6, wherein the mounting groove is provided with a plurality of enforcement ribs on the two lateral surfaces and/or one end surface which matches with the two bending portions.

\* \* \* \* \*